United States Patent
Koike

(10) Patent No.: US 9,350,352 B2
(45) Date of Patent: May 24, 2016

(54) LEVEL SHIFT CIRCUIT AND SWITCHING POWER SOURCE APPARATUS

(75) Inventor: Kengo Koike, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 731 days.

(21) Appl. No.: 12/946,247

(22) Filed: Nov. 15, 2010

(65) Prior Publication Data

US 2011/0115542 A1 May 19, 2011

(30) Foreign Application Priority Data

Nov. 19, 2009 (JP) ................................. 2009-263626

(51) Int. Cl.
*H03K 19/0175* (2006.01)
*H03K 19/0185* (2006.01)

(52) U.S. Cl.
CPC .... *H03K 19/018521* (2013.01); *H03K 19/0185* (2013.01); *H03K 19/017509* (2013.01); *H03K 19/018507* (2013.01); *H03K 19/018514* (2013.01)

(58) Field of Classification Search
None
See application file for complete search history.

(56) References Cited

U.S. PATENT DOCUMENTS

| | | | |
|---|---|---|---|
| 4,760,287 A * | 7/1988 | Goto et al. ........................ | 327/63 |
| 5,552,731 A * | 9/1996 | Diazzi et al. .................... | 327/109 |
| 5,572,156 A * | 11/1996 | Diazzi et al. .................... | 327/109 |
| 6,646,469 B2 * | 11/2003 | Yushan ............................ | 326/83 |
| 6,774,674 B2 * | 8/2004 | Okamoto et al. ................ | 326/80 |
| 7,495,482 B2 * | 2/2009 | Sakai et al. ..................... | 327/108 |
| 7,719,325 B1 * | 5/2010 | Wang et al. ..................... | 327/112 |
| 2003/0107425 A1 * | 6/2003 | Yushan .......................... | 327/333 |
| 2010/0117682 A1 * | 5/2010 | Al-Shyoukh et al. ........... | 326/80 |
| 2010/0164593 A1 * | 7/2010 | Ha et al. ........................ | 327/333 |

FOREIGN PATENT DOCUMENTS

| | | |
|---|---|---|
| JP | 4-230117 | 8/1992 |
| JP | 8-65143 | 3/1996 |
| JP | 9-172366 | 6/1997 |
| JP | 9-200017 | 7/1997 |
| JP | 2000-252809 | 9/2000 |
| JP | 2002-314392 | 10/2002 |

OTHER PUBLICATIONS

Japanese Office Action issued Sep. 13, 2011, in Patent Application No. 2009-263626 (with Partial English translation).

* cited by examiner

*Primary Examiner* — Tuan T Lam
(74) *Attorney, Agent, or Firm* — Oblon, McClelland, Maier & Neustadt, L.L.P.

(57) ABSTRACT

A level shift circuit includes a first resistor connected to a level shift power source, a first transistor having a drain connected to a second end of the first resistor and a source to the ground, a second resistor connected to the level shift power source, a second transistor having a drain connected to a second end of the second resistor and a source to the ground, a pulse generator controlling ON/OFF of the first and second transistors according to an input signal, a control part generating a set signal if the first transistor is ON, a reset signal if the second transistor is ON, and no signal if there is no voltage difference between a voltage at the drain of the first transistor and a voltage at the drain of the second transistor, and a flip-flop providing an output signal according to the set and reset signals.

7 Claims, 9 Drawing Sheets

LEVEL SHIFT CIRCUIT AND SWITCHING POWER SOURCE APPARATUS

BACKGROUND OF THE INVENTION

1. Field of the Invention

The present invention relates to a level shift circuit used as an interface between circuits operating on different power source voltages and a switching power source apparatus employing the level shift circuit.

2. Description of the Related Art

A switching power source apparatus used for a flat panel display, which is strongly required to be thinner, is frequently of a half-bridge type with two switching elements and a current resonant type capable of reducing a switching loss. To miniaturize and thin the flat panel displays such as LCD TVs and other consumer appliances, switching power source apparatuses used with them are required to operate at higher frequencies with the use of smaller parts.

The half-bridge switching power source apparatus employs two n-type MOSFETs and a level shift circuit to transfer a low-side control signal to a high side. When the switching power source apparatus is used with a consumer appliance, an input voltage to a primary-side converter of the apparatus comes from a PFC (power factor correction) circuit conforming to high-frequency regulations and is generally about DC 420 V. Accordingly, the level shift circuit of the switching power source apparatus must shift a low-side voltage to about 420 V. In connection with this, various problems arise and measures to deal with the problems must be taken.

FIG. 1 is a view illustrating a half-bridge, current-resonant power source apparatus employing a level shift circuit according to a related art. The level shift circuit serves as a high-side driver in a control circuit 2.

In FIG. 1, the control circuit 2 alternately turns on/off high- and low-side switching elements to control frequencies and change the charge/discharge period of a resonant capacitor Ci, thereby controlling power induced on the secondary side of a transformer.

Japanese Unexamined Patent Application Publication No. H09-200017 (Patent Document 1) discloses a semiconductor apparatus that prevents a malfunction of a flip-flop that may occur due to a dv/dt current caused by a transient voltage dv/dt, thereby protecting switching elements. FIG. 2 is a circuit diagram illustrating the semiconductor apparatus described in the Patent Document 1. This apparatus includes a level shift circuit serving as a high-side driver HD1. In FIG. 2, switching elements 17 and 18 are connected in series between a power source and the ground, to form a half-bridge power device 19. The switching elements 17 and 18 are, for example, IGBTs (insulated gate bipolar transistors). A connection point N1 of the switching elements 17 and 18 is connected to a load 21 that is an inductive load such as a motor.

The high-side switching element 17 carries out a switching operation between a reference voltage that is a voltage at the connection point N1 and a power source voltage (for example, 420 V) supplied from the power source. On the other hand, the low-side switching element 18 carries out a switching operation between a reference voltage that is a ground voltage and the voltage at the connection point N1.

In the high-side driver HD1 illustrated in FIG. 2, a transient voltage dv/dt is applied, depending on a switching state of the half-bridge power device 19, to a line L1 extending from the connection point N1 to anodes of diodes 8 and 9 and to a high-side circuit that operates on a reference voltage that is a voltage on the line L1. MOSFETs 20 and 30 each have a high withstand voltage (usually about 700 to 1100 V) with respect to drains thereof, and for this, each MOSFET has a large element region and parasitic capacitance among the drain, source, back gate, gate, and sub-substrate thereof.

Accordingly, if there is no filter circuit 26, the high-side driver HD1 passes a dv/dt current that is caused by the product of a transient voltage dv/dt and the parasitic capacitance between the drain and source of each of the MOSFETs 20 and 30. At this time, resistors 4 and 5 simultaneously cause voltage drops to operate inverters 6 and 7 and erroneously apply high-level signals to set and reset terminals of a flip-flop 12.

To prevent this, the high-side driver HD1 illustrated in FIG. 2 arranges the filter circuit 26 before the flip-flop 12. Even if the transient voltage dv/dt is applied to the line L1 to simultaneously pass the dv/dt current to the MOSFETs 20 and 30 and simultaneously cause voltage drops at the resistors 4 and 5, the filter circuit 26 blocks the high-level signals from the inverters 6 and 7.

Namely, the filter circuit 26 provides no high-level signals to the flip-flop 12 until a delay time determined by a time constant of a CR filter of the filter circuit 26 elapses. This delay time is set to be longer than the duration of the transient voltage dv/dt, so that no high-level signal due to the dv/dt current is passed to the flip-flop 12, thereby preventing the flip-flop 12 from malfunctioning.

At this time, the pulse width of each of ON and OFF signals provided by a pulse generator 10 is set to be sufficiently longer than the duration of the transient voltage dv/dt, i.e., the delay time of the filter circuit 26, so that output signals from the inverters 6 and 7 based on the ON and OFF signals from the pulse generator 10 are given to the flip-flop 12 to normally operate the flip-flop 12.

FIG. 3 is a timing chart illustrating operation of the semiconductor apparatus of FIG. 2 according to the related art of the Patent Document 1. To turn on the switching element 17, the pulse generator 10 provides a high-level ON signal and a low-level OFF signal. The ON-side CR filter receives a high-level signal from the inverter 7 and provides an output signal that gradually rises until a capacitor 25 is charged. Thereafter, the output signal similarly falls. When the output from the ON-side CR filter completely rises, the flip-flop 12 outputs a high-level signal from an output terminal Q thereof.

To turn off the switching element 17, the pulse generator 10 outputs a low-level ON signal and a high-level OFF signal. In this case, the OFF-side CR filter receives a high-level signal from the inverter 6 and provides an output signal that gradually rises until a capacitor 24 is charged. Thereafter, the output signal similarly falls. When the output from the OFF-side CR filter completely rises, the flip-flop 12 outputs a low-level signal from the output terminal Q.

The switching element 17 is ON during a period in which the flip-flop 12 outputs a high-level signal from the output terminal Q. Compared with the case having no filter circuit 26, the output from the output terminal Q of the flip-flop 12 is delayed by the delay time of the ON-side (OFF-side) CR filter.

As mentioned above, the pulse width of an ON (OFF) signal to the MOSFET 20 (30) must be longer than the delay time provided by the filter circuit 26. To prevent malfunctions, the delay time (filtering time) of the filter circuit 26 must be long. This, however, increases power consumption. To deal with this problem, the Patent Document 1 also discloses a semiconductor apparatus having a protection circuit made of a logic circuit that produces no delay time.

Japanese Unexamined Patent Application Publication No. H04-230117 (Patent Document 2) discloses a level shift circuit having an interference eliminating function with respect to the transient voltage dv/dt. This level shift circuit has a pulse filter circuit that identifies, based on a pulse width, a pulse caused by the transient voltage dv/dt and passes only a normal operation pulse, thereby preventing a malfunction due to the transient voltage dv/dt.

Japanese Unexamined Patent Application Publication No. H08-65143 (Patent Document 3) discloses a level shift circuit having a reset priority circuit. The reset priority circuit operates a reset level circuit with an input signal whose value is lower than that of an input signal for operating a set level circuit, to thereby turn off a power MOSFET. This level shift circuit enlarges a reset voltage drop resistor, or adjusts the input threshold values of devices to read the reset and set voltage drop resistors, thereby realizing the reset priority and preventing malfunctions due to noise.

The reset priority concept is applicable to the level shift circuit illustrated in FIG. 2. By enlarging the reset-side resistor 4, the level shift circuit of FIG. 2 can realize the reset priority to turn off the high-side switching element 17, thereby preventing the switching elements 17 and 18 from simultaneously turning on.

Japanese Unexamined Patent Application Publication No. H09-172366 (Patent Document 4) discloses an inverter apparatus that interposes a transmission unit between an ON-side pulse transmission system and an OFF-side pulse transmission system, to lower the resistance value of one of the transmission systems when the other transmits a signal. In addition, this inverter apparatus enlarges a resistance value on a reset side, to realize a reset priority configuration. When a transient voltage dv/dt occurs, the OFF-side pulse transmission system causes a large resistance voltage drop. At this time, the interposed transmission unit lowers the resistance value of the ON-side pulse transmission system, thereby preventing a resistance voltage drop from occurring on the ON side. As a result, an OFF-side pulse voltage is transmitted to a flip-flop, to reset the flip-flop and prevent a malfunction due to the transient voltage dv/dt.

SUMMARY OF THE INVENTION

There are two typical cases that a transient voltage dv/dt is applied to a level shift circuit. In the first case, a low-side switching element is OFF and a high-side switching element is turned on to shift 0 V to 420 V, or the high-side switching element is OFF and the low-side switching element is turned on to shift 420 V to 0 V. In this case, the transient voltage dv/dt is applied to the level shift circuit in synchronization with the turning on/off of the switching elements. It is necessary, therefore, to take a measure to prevent a malfunction against the transient voltage dv/dt caused by the turning on/off of the switching elements.

Another example of the first case occurs when the low-side switching element is OFF and the high-side switching element is turned on, so that the transient voltage dv/dt changing from about 0 V to about 420 V is applied to a load and the level shift circuit, to erroneously produce a reset signal. The erroneous reset signal turns off the high-side switching element without regard to a low-side control signal. If this happens, the erroneously turned off high-side switching element causes a drop in an output voltage of a switching power source apparatus in which the level shift circuit is arranged, or noise from a transformer arranged in the switching power source apparatus.

The second case occurs in a current-resonant switching power source apparatus having a level shift circuit. In this case, the transient voltage dv/dt is indirectly applied to the level shift circuit without regard to the on/off operation of a high-side switching element. The switching power source apparatus of this type adds a resonant circuit to a load of a half-bridge circuit, and therefore, a current is passed through the resonant circuit at a switching operation, to apply the transient voltage dv/dt to the level shift circuit. With the resonant circuit, the current-resonant switching power source apparatus achieves ZVS (zero volt switching) or ZCS (zero current switching), to reduce a switching loss, improve power source efficiency, and minimize noise. In the current-resonant switching power source apparatus, the magnitude and duration of the transient voltage dv/dt are dependent on a state of the load. Accordingly, the current-resonant switching power source apparatus must take a measure against a malfunction to be caused by the transient voltage dv/dt. Namely, the level shift circuit of the current-resonant switching power source apparatus must be designed in consideration of any situation that may cause the transient voltage dv/dt.

A problem concerning the duration of the transient voltage dv/dt will be explained in connection with higher switching frequencies needed by the market. At present, the current-resonant switching power source apparatuses generally employ an oscillation frequency of about 100 kHz. In this case, one period is 10 µs including a low-side interval of 5 µs and a high-side interval of 5 µs. More precisely, the 10-µs period includes a low-to-high (0 V to 420 V) shift duration of 0.5 µs, a high-side (420 V) ON time of 4.5 µs, a high-to-low (420 V to 0 V) shift duration of 0.5 µs, and a low-side (0 V) ON time of 4.5 µs. Here, the shift duration corresponds to the duration of the transient voltage dv/dt.

If the oscillation frequency is increased to 500 kHz, the low-to-high (0 V to 420 V) shift duration is 0.5 µs, the high-side (420 V) ON time is 0.5 µs, the high-to-low (420 V to 0 V) shift duration is 0.5 µs, and the low-side (0 V) ON time is 0.5 µs.

In this case, the ON time of each switching element is short, and within this short ON time, a current passes through the switching element. This results in increasing an effective current relative to a mean current and deteriorating efficiency. Accordingly, when increasing the oscillation frequency, the duration of the transient voltage dv/dt must be shortened. Shortening the duration of the transient voltage dv/dt, however, results in increasing a surge voltage. A level shift circuit of a switching power source apparatus used for a consumer appliance uses 0 V to 10 V on the low side and about 420 V on the high side, to involve a level shift of about 420 V. A time period to achieve such a level shift has a limit. Shortening the level shift period results in increasing the transient voltage dv/dt, heightening the surge voltage, and enlarging radiant noise. It is impossible, therefore, to extremely shorten the duration of the transient voltage dv/dt.

Possible values are, for example, a low-to-high (0 V to 420 V) shift duration of 0.25 µs, a high-side (420 V) ON time of 0.75 µs, a high-to-low (420 V to 0 V) shift duration of 0.25 µs, and a low-side (0 V) ON time of 0.75 µs. In the future, switching elements operating at higher frequencies, techniques to reduce noise, and materials suitable for high frequencies will be developed. Then, it will be possible to further reduce the duration of the transient voltage dv/dt.

According to the above-mentioned example, a ratio of the duration of the transient voltage dv/dt is 25% per period (one period being 2.0 µs including the duration of the transient voltage dv/dt of 0.5 µs and the element ON time of 1.5 µs). When increasing the operating frequency of a level shift circuit, it is necessary to consider an occasion that a set or reset signal is provided during the low-to-high (or high-to-low) shift duration. Even in this case, the set or reset signal must correctly be transmitted.

The semiconductor apparatus of the Patent Document 1 or the inverter apparatus of the Patent Document 4 prevents a malfunction by inserting a protective circuit for the high-side flip-flop when the transient voltage dv/dt increases. When the protective circuit is in operation, these related arts are unable to send a regular ON/OFF signal from the low side to the high side. Then, the high side is unable to operate, thereby causing an output decrease or noise in the case of a motor and an output voltage drop or transformer noise in the case of a switching power source apparatus.

These problems will not be serious in the case of a motor that employs IGBT switching elements operating at several tens of kilohertz at the maximum. However, they are serious when operating a current-resonant switching power source apparatus at increased frequencies.

To increase the frequency of the level shift circuit in the apparatuses of the Patent Documents 1 and 4 without causing the above-mentioned problem, constants must properly be set not to activate the protective circuit under normal conditions. For example, the resistance values of the resistors 4 and 5 illustrated in FIG. 2 are decreased to cause little voltage drops at the resistors 4 and 5 with respect to the transient voltage dv/dt, so that the detection devices arranged after the resistors 4 and 5 do not operate. In addition, currents passed to the MOSFETs 20 and 30 must be increased to pass currents necessary for operating the detection devices. These factors, however, raise another problem. As the frequency of the level shift circuit increases, the transient voltage dv/dt increases. For this, the resistance values of the resistors 4 and 5 must further be decreased and currents passed to the MOSFETs 20 and 30 must further be increased, thereby increasing current consumption.

There is a commercial product employing a control circuit that prohibits signal transmission from the low side to the high side during the low-to-high (or high-to-low) shift duration. This technique, however, increases circuit size. If the shift duration becomes the order of nanoseconds due to high frequencies, a delay in the control circuit raises a serious problem. This is because the control circuit starts signal transmission after detecting that the low-to-high (or high-to-low) shift duration has ended. For this, the control circuit needs a detection time of about 50 to 300 ns. If the frequency is increased to 500 kHz, one period is 2 µs, and therefore, the detection time of about 50 to 300 ns that shortens the device ON time is critical.

There is an idea to extend the pulse width of a set (reset) signal longer than an estimated low-to-high (high-to-low) shift duration, so that a signal is correctly transmitted from the low side to the high side. This idea, however, naturally increases power consumption.

When increasing the frequency of a circuit, a circuit current must be reduced. A control IC for an inexpensive general-purpose consumer switching power source is generally supplied with a package of SOP8 to SOP16 or DIP8 to DIP16. Thermal resistance of these packages is about 80 to 200° C. (joint to package surface). Power consumption of such a control IC is preferably 0.5 to 0.8 W (a temperature increase of 50 to 80° C. at a thermal resistance of 100° C./W) or lower in consideration of reliability. Power supplied to the level shift circuit of FIG. 2 is mostly consumed by currents passed to the MOSFETs 20 and 30. Accordingly, if the resistors 4 and 5 have a resistance value of 1 kΩ, the MOSFETs 20 and 30 will be designed to pass 10 to 20 mA so that a voltage of about 10 to 20 V is generated across each of the resistors 4 and 5.

The pulse width of a gate drive signal to the MOSFETs 20 and 30 is about 50 to 200 ns. With an oscillation frequency of 100 kHz, an input voltage of 420 V, 20 mA, 100 ns, and two pulses (set and reset), power consumption is calculated as 420 V×0.02 A×100 ns×2×100 kHz=0.168 W. If the oscillation frequency is 500 kHz, power consumption is calculated as 420 V×0.02 A×100 ns×2×500 kHz=0.84 W.

Although the control IC as a whole further involves gate charge/discharge currents for switching devices and currents for control devices, the power consumption of the level shift circuit is not ignorable. In proportion to the oscillation frequency, the power consumption increases. If the resistance values of the resistors 4 and 5 illustrated in FIG. 2 are increased and currents passed to the MOSFETs 20 and 30 are reduced, it will be possible to secure an input voltage to the level shift circuit and reduce power consumption. This, however, needs careful designing in consideration of the problems mentioned above. Heat generation is also a serious problem when increasing the oscillation frequency. In connection with this, it will be effective to employ a package having low thermal resistance. This, however, increases the cost of a product and deteriorates market competitiveness.

The present invention provides a level shift circuit that is manufacturable at low cost, is appropriate for miniaturization, consumes little power, is operable at high frequencies, and prevents the transient voltage dv/dt from malfunctioning a flip-flop, as well as a switching power source apparatus employing the level shift circuit.

According to an aspect of the present invention, the level shift circuit includes a first resistor having a first end connected to a level shift power source, a first n-type MOSFET having a drain connected to a second end of the first resistor and a source connected to the ground, a second resistor having a first end connected to the level shift power source, the first and second resistors having the same resistance value, a second n-type MOSFET having a drain connected to a second end of the second resistor and a source connected to the ground, a pulse generator configured to control ON/OFF of the first and second n-type MOSFETs according to an input signal, a control part configured to generate a set signal if the first n-type MOSFET is ON, a reset signal if the second n-type MOSFET is ON, and no signal if there is no voltage difference between a voltage at the drain of the first n-type MOSFET and a voltage at the drain of the second n-type MOSFET, and a flip-flop configured to provide an output signal according to the set and reset signals generated by the control part, the output signal being a level-shifted signal of the input signal.

According to another aspect of the present invention, the switching power source apparatus has a high-side switching element, a low-side switching element, and the above-mentioned level shift circuit to control the high-side switching element.

DESCRIPTION OF THE PREFERRED EMBODIMENT

Level shift circuits and a switching power source apparatus according to embodiments of the present invention will be explained in detail with reference to the drawings.

Embodiment 1

Figure 4:
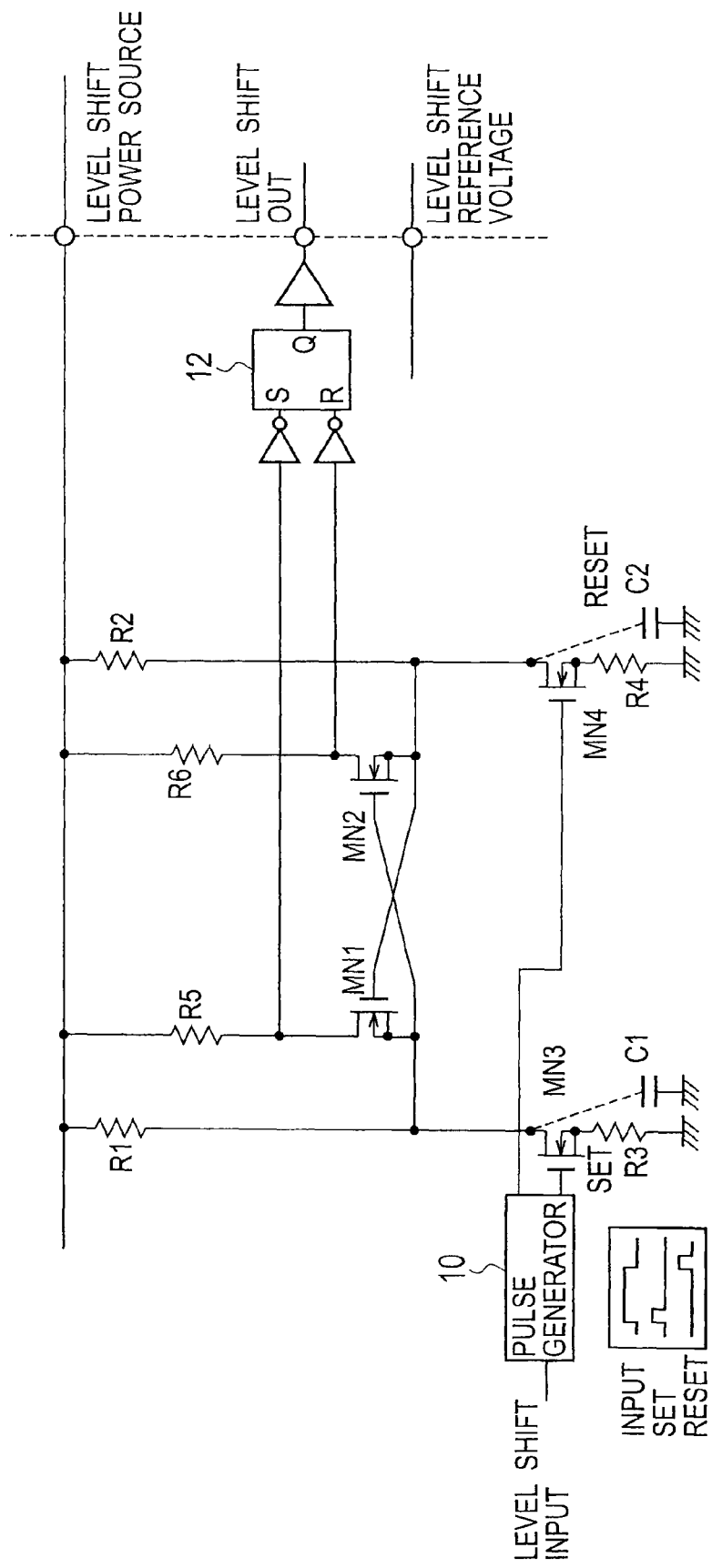
FIG. 4 is a circuit diagram illustrating a level shift circuit according to Embodiment 1 of the present invention.

FIG. 4 is a circuit diagram illustrating a level shift circuit according to Embodiment 1 of the present invention. The level shift circuit has resistors R1 to R6, a pulse generator 10, transistors MN1, MN2, MN3, and MN4, and a flip-flop 12. The level shift circuit of Embodiment 1 is not provided with the filter circuit 26 of the related art of FIG. 2, and instead, is provided with the resistors R5 and R6 and transistors MN1 and MN2.

Figure 5:
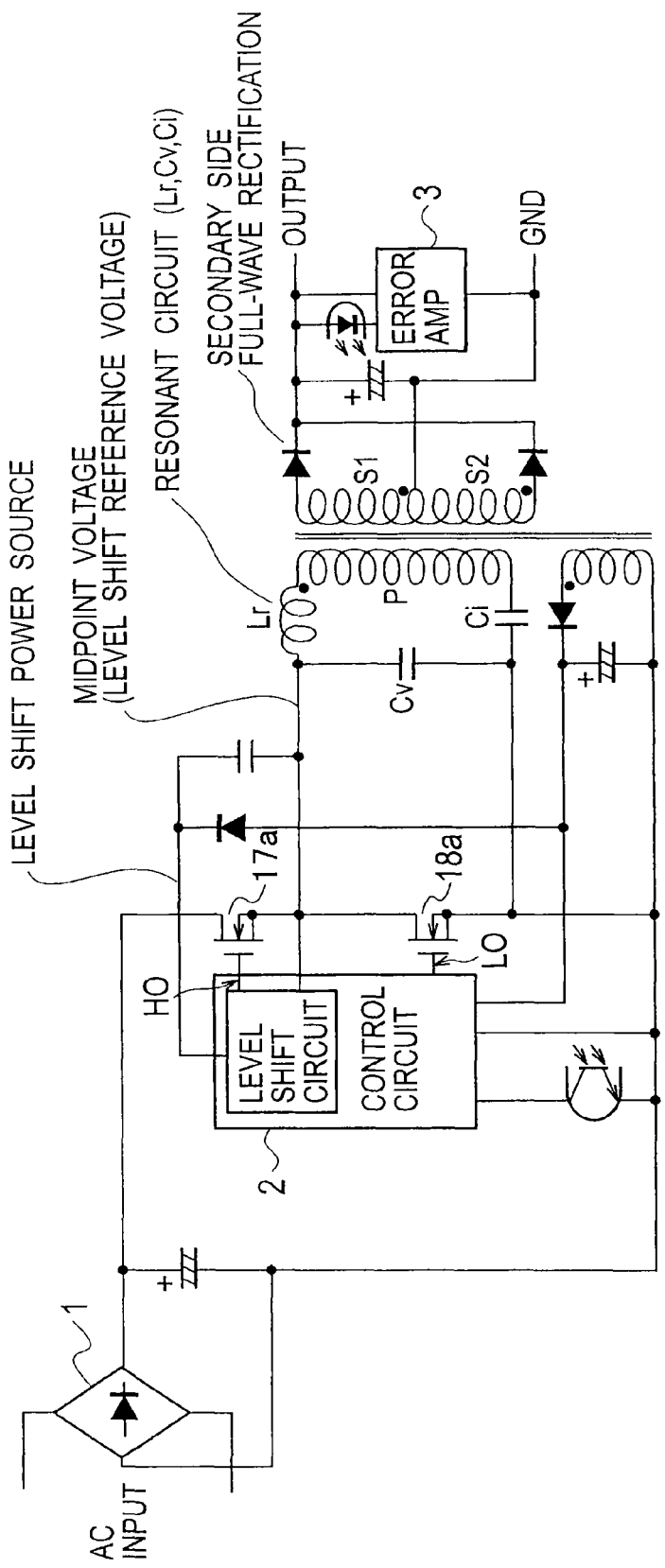
FIG. 5 is a circuit diagram illustrating a switching power source apparatus employing the level shift circuit of FIG. 4.

FIG. 5 is a circuit diagram illustrating a switching power source apparatus employing the level shift circuit of FIG. 4. The switching power source apparatus is a half-bridge, current-resonant switching power source apparatus having a high-side switching element 17a and a low-side switching element 18a. To control the high-side switching element 17a, the level shift circuit is arranged in a control circuit 2. The present invention is also applicable to a full-bridge switching power source apparatus.

In the switching power source apparatus of FIG. 5, the control circuit 2 alternately turns on/off the high- and low-side switching elements 17a and 18a, to control frequencies and change the charge and discharge periods of a resonant capacitor Ci, thereby controlling the amount of power induced on the secondary side of a transformer.

In FIG. 5, a midpoint voltage (level shift reference voltage) is a voltage on a line extending between a source of the high-side switching element 17a and a drain of the low-side switching element 18a. The level shift reference voltage point has a predetermined voltage difference with respect to a level shift power source. According to the present embodiment, the voltage difference between the level shift power source and the level shift reference voltage is in the range of about 5 V to 20 V.

The resistor R1 of FIG. 4 corresponds to the "first resistor" stipulated in the claims. A first end of the resistor R1 is connected to the level shift power source and a second end thereof is connected to a drain of the transistor MN3.

The transistor MN3 corresponds to the "first n-type MOSFET" stipulated in the claims and has the drain connected to the second end of the resistor R1 and a source connected to the ground. According to the present embodiment, the source of the transistor MN3 is connected through the resistor R3 to the ground. The resistor R3 corresponds to the "seventh resistor" stipulated in the claims and is connected between the source of the transistor MN3 and the ground. Between the drain of the transistor MN3 and the ground, there is a parasitic capacitance C1. A gate of the transistor MN3 is connected to the pulse generator 10.

The resistor R2 corresponds to the "second resistor" stipulated in the claims. The resistors R1 and R2 have the same resistance value. A first end of the resistor R2 is connected to the level shift power source and a second end thereof is connected to a drain of the transistor MN4. The resistors R1 and R2 each have a resistance value in the range of, for example, 1 kΩ to 10 kΩ.

The transistor MN4 corresponds to the "second n-type MOSFET" stipulated in the claims and has the drain connected to the second end of the resistor R2 and a source connected to the ground. According to the present embodiment, the source of the transistor MN4 is connected through the resistor R4 to the ground. The resistor R4 corresponds to the "eighth resistor" stipulated in the claims and is connected between the source of the transistor MN4 and the ground. Between the drain of the transistor MN4 and the ground, there is a parasitic capacitance C2. A gate of the transistor MN4 is connected to the pulse generator 10.

The pulse generator 10 controls ON/OFF of the transistors MN3 and MN4 according to an input signal. As illustrated below the pulse generator 10 in FIG. 4, the pulse generator 10 outputs a set pulse signal to the gate of the transistor MN3 in response to a rise of the input signal and outputs a reset pulse signal to the gate of the transistor MN4 in response to a fall of the input signal.

The pulse width of each of the gate drive pulses to the transistors MN3 and MN4 is in the range of, for example, 10 ns to 200 ns.

The resistors R5 and R6 and transistors MN1 and MN2 correspond to the "control part" stipulated in the claims. This control part generates a set signal if the transistor MN3 is ON, a reset signal if the transistor MN4 is ON, and no signal if there is no voltage difference between a voltage at the drain of the transistor MN3 and a voltage at the drain of the transistor MN4.

The resistor R5 corresponds to the "fifth resistor" stipulated in the claims and has a first end connected to the level shift power source and a second end connected to a drain of the transistor MN1.

The transistor MN1 corresponds to the "third n-type MOSFET" stipulated in the claims and has the drain connected to the second end of the resistor R5 and a set terminal of the flip-flop 12, a source connected to the drain of the transistor MN3, and a gate connected to the drain of the transistor MN4. According to the first embodiment, the drain of the transistor MN1 is connected through an inverter to the set terminal of the flip-flop 12.

The resistor R6 corresponds to the "sixth resistor" stipulated in the claims. The resistors R5 and R6 have the same resistance value. The resistor R6 has a first end connected to the level shift power source and a second end connected to a drain of the transistor MN2. The resistors R5 and R6 each have a resistance value about two to twenty times as large as the resistance value of the resistor R1 (R2).

The transistor MN2 corresponds to the "fourth n-type MOSFET" stipulated in the claims and has the drain connected to the second end of the resistor R6 and a reset terminal of the flip-flop 12, a source connected to the drain of the transistor MN4, and a gate connected to the drain of the transistor MN3. According to the present embodiment, the drain of the transistor MN2 is connected through an inverter to the reset terminal of the flip-flop 12.

The detection inverters connected to the resistors R5 and R6 each have a threshold that is 50% (i.e. between 20% and 80%) of the voltage difference between the level shift power source and the level shift reference voltage point.

The flip-flop 12 provides an output signal according to the set and reset signals provided by the control part, the output signal being a level-shifted signal of the input signal. According to the present embodiment, the output signal from the flip-flop 12 is applied to a gate of the high-side switching element 17a (FIG. 5).

Operation of Embodiment 1 will be explained. The level shift circuit according to the present embodiment achieves three operations and each of which will be explained.

Figure 6:
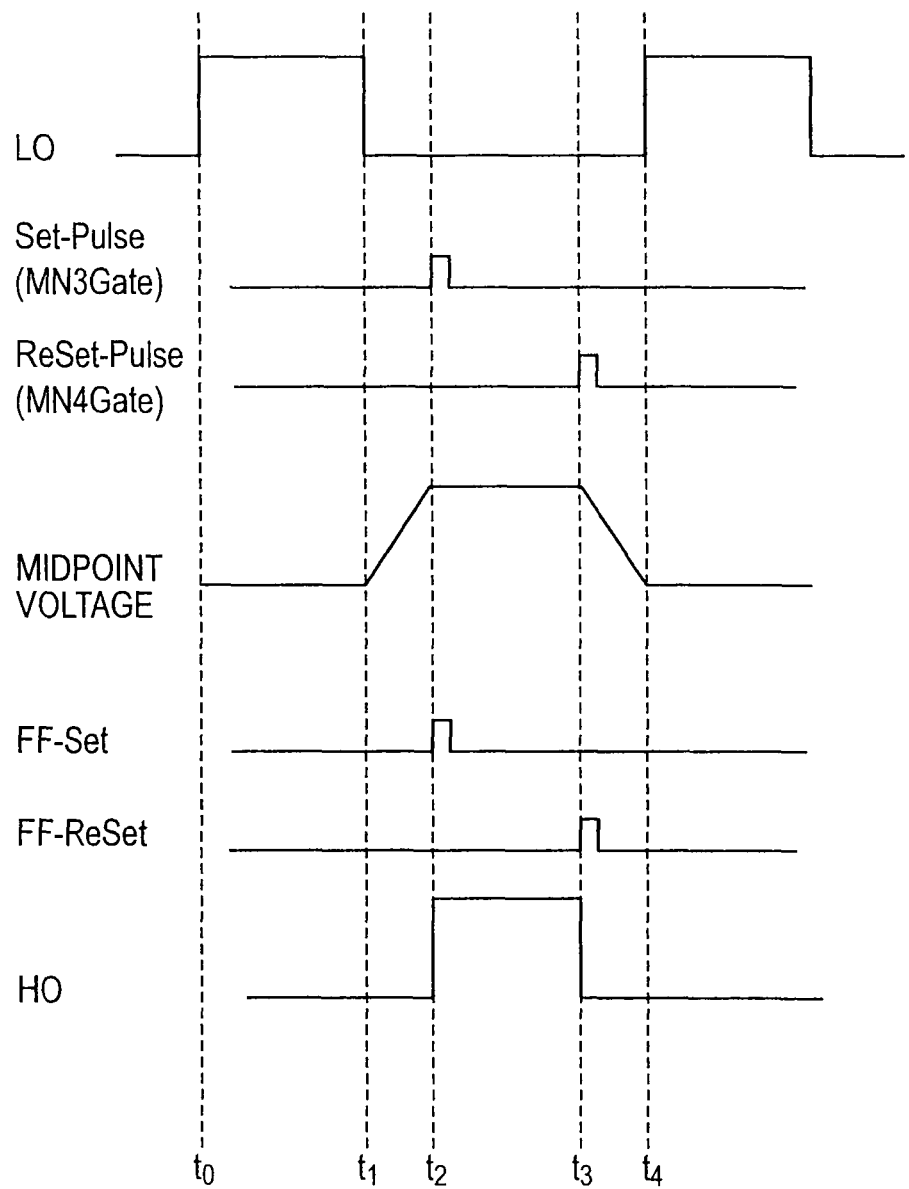
FIGS. 6 to 8 are timing charts illustrating operating states of the level shift circuit of FIG. 4.

First, a malfunction preventing operation achieved by the level shift circuit when a transient voltage dv/dt is applied will be explained with reference to the timing chart of FIG. 6. This operation is carried out by the level shift circuit in the current-resonant switching power source apparatus of FIG. 5. In FIG. 6, LO is a voltage applied to a gate of the low-side switching element 18a and HO is a voltage applied to the gate of the high-side switching element 17a.

At time t1, the low-side switching element 18a is turned off. During an interval from t1 to t2, the midpoint voltage (level shift reference voltage) changes from 0 V to 420 V due to the influence of a resonant circuit, to produce a transient voltage dv/dt. At time t2, the midpoint voltage reaches a peak to turn on the high-side switching element 17a. As a result, a terminal-to-terminal voltage of the high-side switching element 17a becomes nearly 0 V, and therefore, the switching power source apparatus of FIG. 5 can carry out ZVS (zero volt switching) to reduce a switching loss, improve power source efficiency, and minimize noise.

When the transient voltage dv/dt is applied, a current proportional to the transient voltage dv/dt passes through the resistors R1 and R2 to charge the parasitic capacitances C1 and C2. As a result, the resistors R1 and R2 cause voltage drops. The voltage drops of the resistors R1 and R2 are equal to each other, and therefore, no voltage difference occurs between a voltage at the drain of the transistor MN3 and a voltage at the drain of the transistor MN4. Accordingly, the transistors MN1 and MN2 each have a gate-source voltage of about 0 V to keep an OFF state, thereby preventing the resistors R5 and R6 from causing voltage drops. As a result, the control part (R5, R6, MN1, MN2) provides the inverters and flip-flop 12 with no signal, thereby preventing the transient voltage dv/dt from causing a malfunction.

Figure 1:
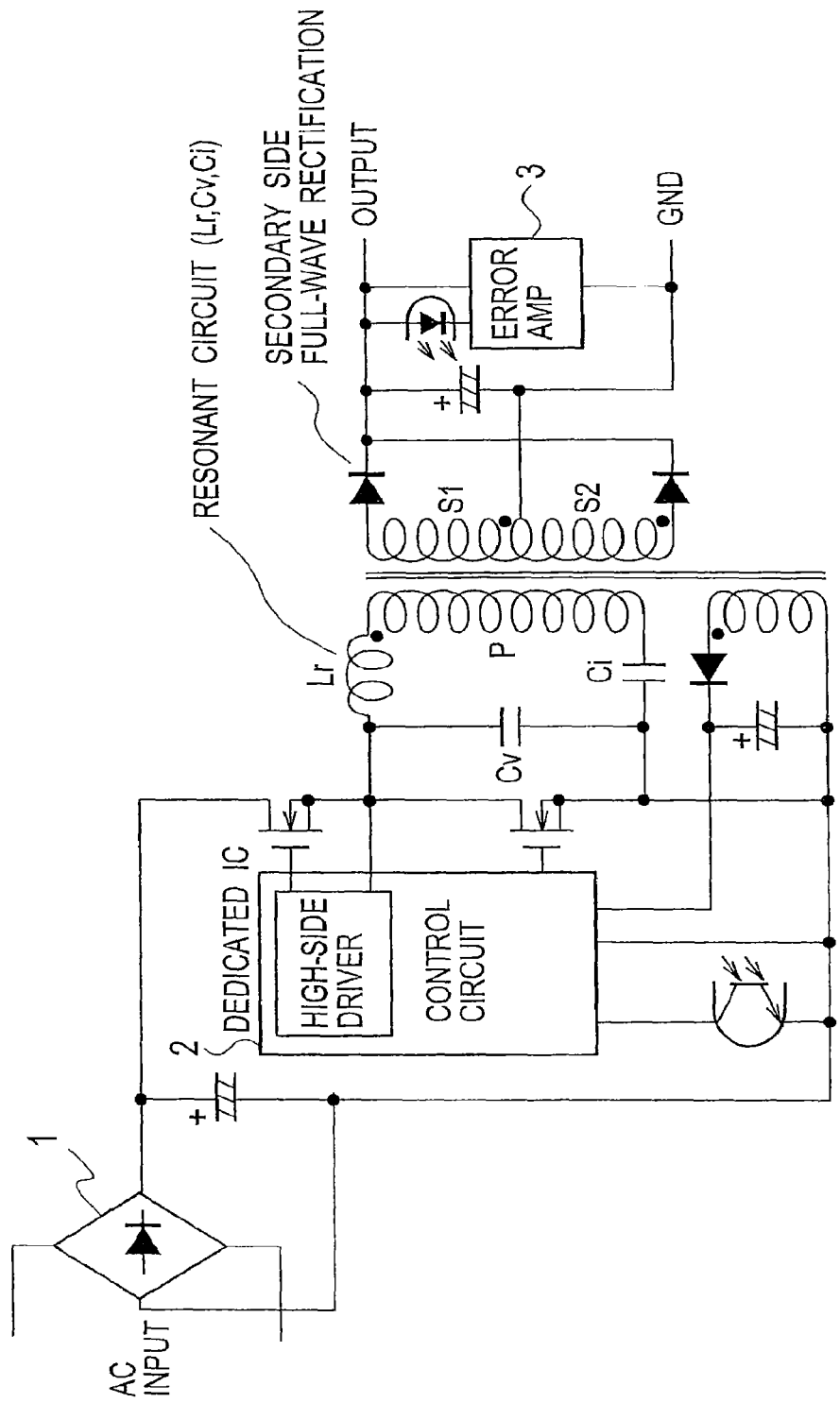
FIG. 1 illustrates a half-bridge, current resonant switching power source apparatus employing a level shift circuit according to a related art.
Figure 2:
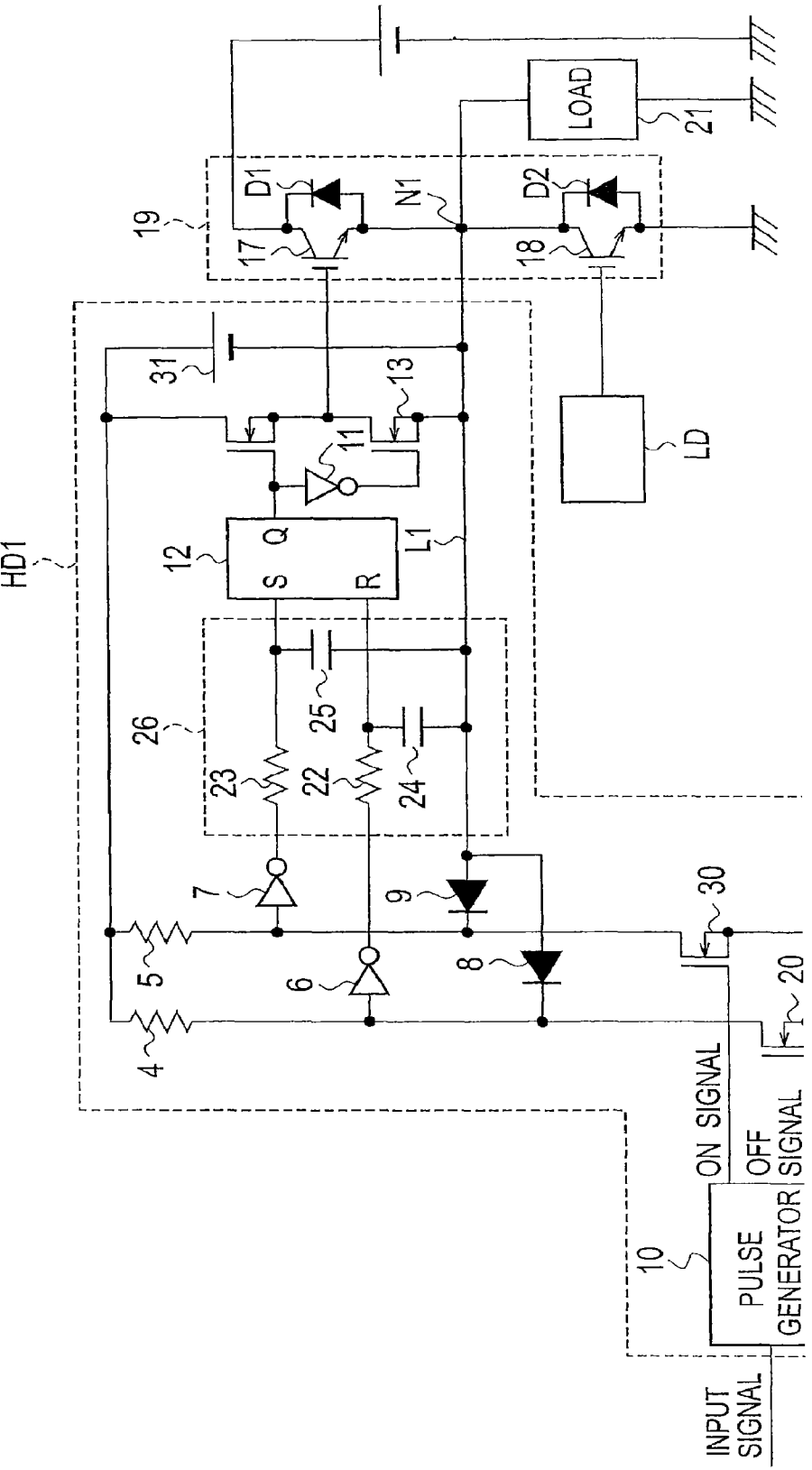
FIG. 2 is a circuit diagram illustrating a semiconductor apparatus including a level shift circuit according to a related art.
Figure 3:
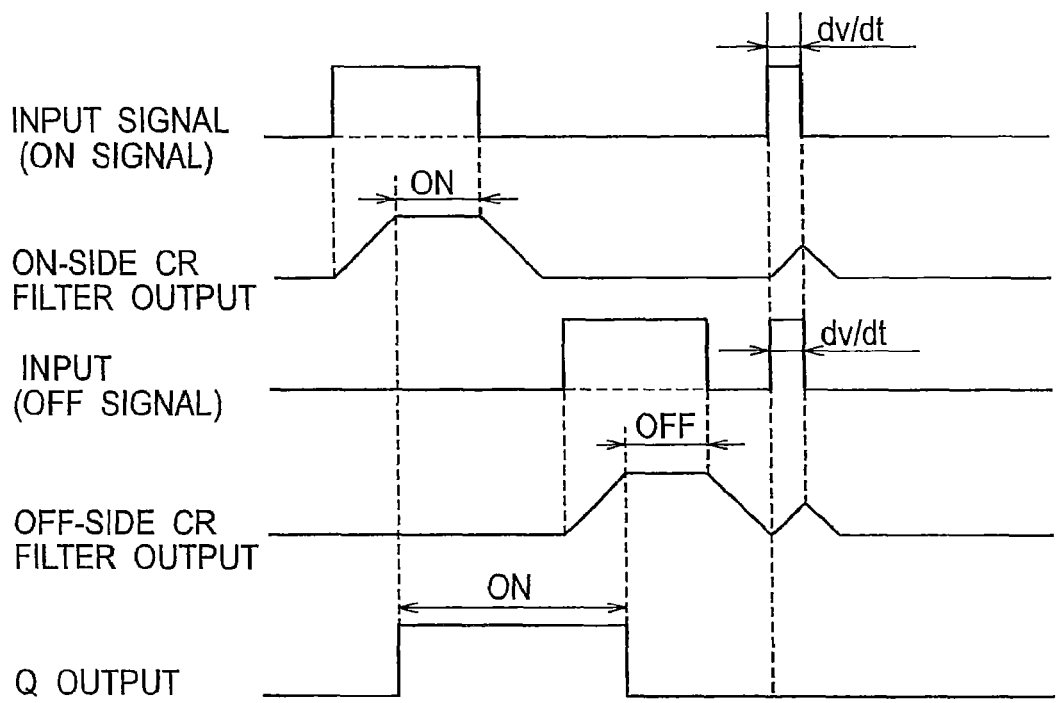
FIG. 3 is a timing chart illustrating operation of the semiconductor apparatus of FIG. 2.

On the other hand, according to the related art of FIG. 2, the transient voltage dv/dt causes current proportional to the transient voltage dv/dt passing through the resistors 4 and 5 to charge the parasitic capacitances C1 and C2, thereby causing voltage drops at the resistors 4 and 5. When the voltage drops reach the threshold values of the inverters 6 and 7, signals are supplied to the circuit elements arranged after the inverters 6 and 7. These signals are cut off by the filter circuit 26. The related art of FIG. 2 extends the pulse width of each of ON and OFF signals provided by the pulse generator 10 sufficiently longer than the delay time of the filter circuit 26, and therefore, increases power consumption. If a noise signal exceeding the processing capacity of the filter circuit 26 is applied to the filter circuit 26, the filter circuit 26 will send erroneous signals to the flip-flop 12, to destabilize the operation of the level shift circuit and cause malfunctions.

A set (reset) pulse transmitting operation achieved by the level shift circuit of the present embodiment will be explained. Set pulse transmission and reset pulse transmission are the same as each other except for transistors and resistors used thereby. Accordingly, only the set pulse transmission will be explained.

At time t2 in FIG. 6, the pulse generator 10 outputs a set pulse signal to the gate of the transistor MN3, to turn on the transistor MN3 and pass a current through the resistor R1. This produces a voltage difference between ends of the resistor R1, to decrease the source voltage of the transistor MN1. When the gate-source voltage of the transistor MN1 exceeds a threshold value, the transistor MN1 turns on to pass a current through the resistor R5. When a voltage drop at the resistor R5 reaches the threshold of the inverter arranged after the resistor R5, a set signal is supplied to the flip-flop 12, so that the flip-flop 12 provides the gate of the high-side switching element 17a with a high-level output signal, to turn on the switching element 17a.

Finally, a low-side to high-side signal transmitting operation of the present embodiment under the occurrence of a transient voltage dv/dt will be explained with reference to FIG. 7. This operation is carried out by the level shift circuit of FIG. 4 arranged in the current-resonant switching power source apparatus of FIG. 5.

At time t1, the low-side switching element 18a is turned off. The midpoint voltage (level shift reference voltage) starts to rise from 0 V due to the resonant circuit, to produce a transient voltage dv/dt. A current proportional to the transient voltage dv/dt passes through the resistors R1 and R2 to charge the parasitic capacitances C1 and C2. As a result, the resistors R1 and R2 cause voltage drops. The voltage drops of the resistors R1 and R2 are equal to each other, and therefore, no voltage difference occurs between a voltage at the drain of the transistor MN3 and a voltage at the drain of the transistor MN4. Accordingly, the gate-source voltage of each of the transistors MN1 and MN2 is about 0 V, and therefore, the transistors MN1 and MN2 keep an OFF state, thereby preventing the resistors R5 and R6 from causing voltage drops. As a result, no signal is transmitted to the circuit elements arranged after the resistors R5 and R6.

In this state, the pulse generator 10 provides the gate of the transistor MN3 with a set pulse signal (time t2), to turn on the transistor MN3. Then, the drain voltage of the transistor MN3, i.e., the source voltage of the transistor MN1 decreases lower than the drain voltage of the transistor MN4, i.e., the source voltage of the transistor MN2. This causes a voltage difference between the source and gate of the transistor MN1, and if the voltage difference is equal to or higher than the threshold value, the transistor MN1 turns on to produce a voltage drop at the resistor R5, thereby supplying a set signal through the inverter to the flip-flop 12. Namely, the control part (R5, R6, MN1, MN2) of the level shift circuit according to the present embodiment generates a set signal if the transistor MN3 is ON, without regard to the transient voltage dv/dt.

When receiving the set signal, the flip-flop 12 provides the gate of the high-side switching element 17a with a high-level output signal, to turn on the switching element 17a. As a result, the midpoint voltage steeply increases to 420 V at time t2.

On the other hand, the related art disclosed in the Patent Document 1 activates the protection circuit when a transient voltage dv/dt is applied, and therefore, is unable to send a set signal to the flip-flop 12. Further, the related art of the Patent Document 2 that identifies a transient voltage dv/dt according to the pulse width thereof is unable to identify the same at high frequencies.

The related arts of the Patent Documents 3 and 4 that employ the reset priority circuit increase a reset-side resistance so that a reset signal is sent to the flip-flop when a transient voltage dv/dt is applied. Accordingly, if a set signal is provided under the transient voltage dv/dt, both the set and reset signals are supplied to the flip-flop, to destabilize the flip-flop.

When adopting the reset priority circuit, it is usual to take a measure for preventing a transient voltage dv/dt from causing a malfunction. For this, it is general to decrease the resistance values of the set-side resistor (the resistor 5 in FIG. 2) and reset-side resistor (the resistor 4 in FIG. 2). Accordingly, when transmitting a set signal from the low side to the high side, a large current must be passed to the set-side resistor, thereby raising a problem of increasing power consumption.

As mentioned above, the level shift circuit according to the present embodiment and the switching power source apparatus employing the level shift circuit are manufacturable at low cost, are appropriate for miniaturization, and are capable of reducing power consumption, operating at high frequencies, and preventing a transient voltage dv/dt from malfunctioning a flip-flop.

Namely, the level shift circuit according to the present embodiment needs no filter circuit 26 of the related art illustrated in FIG. 2, and therefore, is capable of reducing circuit size, operating at high frequencies without involving a delay time, and reducing power consumption by minimizing the pulse widths of drive pulses for the transistors MN3 and MN4.

The level shift circuit according to the present embodiment is capable of transmitting a signal from the low side to the high side in a wider range than the related arts without regard to the transient voltage dv/dt. To increase frequencies, the related arts of the Patent Documents 1 and 4 must decrease the resistance values of the resistors 4 and 5 illustrated in FIG. 2 so that the protection circuit may not operate under normal conditions. This idea, however, increases power consumption in proportion to an increase in the frequencies. On the other hand, the level shift circuit according to the present embodiment can increase the resistance values of the resistors R1 and R2 to decrease currents passed to the transistors MN3 and MN4, thereby reducing power consumption. Consequently, the level shift circuit of the present embodiment reduces heat generation compared with the related arts. With respect to a package having a given heat generation allowance, the level shift circuit of the present embodiment allows frequencies to be increased and the switching power source apparatus to be miniaturized.

An example of calculation of power consumption will be explained. To carry out the calculation, an assumption is made that the voltage difference between the level shift power source and the level shift reference voltage is 10 V, and the threshold of each signal detecting inverter is 5 V. Even if the frequency is increased, the level shift circuit is required to transmit signals from the low side to the high side without regard to the transient voltage dv/dt. For this, the level shift circuit of any one of the Patent Documents 1, 2, and 3 must set constants so that the inverters do not operate by voltage drops of resistors (the resistors 4 and 5 of FIG. 2) caused by the transient voltage dv/dt. For example, each of the resistors 4 and 5 is estimated to cause a voltage drop of 2 V with respect to a presumed transient voltage dv/dt and the parasitic capacitance value of a corresponding one of the MOSFETs 20 and 30. Then, the resistance value of each of the resistors 4 and 5 is assumed to be 1 kΩ.

According to Embodiment 1 of the present invention, the level shift circuit never transmits signals to the inverters even if the voltage drop of each of the resistors R1 and R2 is 5 V or over. Accordingly, the level shift circuit of the present embodiment can set the resistance value of each of the resistors R1 and R2 to 2.5 kΩ, to reduce the drain current of each of the transistors MN3 and MN4 to 1/2.5, thereby greatly reducing a level shift loss.

If the related art of any one of the Patent Documents 1, 2, and 3 takes such a large resistance value, no signal will be transmitted once the transient voltage dv/dt is applied. Accordingly, these related arts are improper for taking a large resistance value to increase frequencies. On the other hand, the level shift circuit according to Embodiment 1 can transmit signals without regard to the resistance values of the resistors R1 and R2 even when the transient voltage dv/dt is applied. Accordingly, the level shift circuit of the present embodiment can easily increase frequencies and can halve a loss compared with the related arts even if variations are considered.

The level shift circuit according to Embodiment 1 employs the resistors R3 and R4 to limit currents when the transistors MN3 and MN4 are turned on. More precisely, the source current of the transistor MN3 (MN4) causes a voltage drop across the resistor R3 (R4). The pulse generator 10 provides a pulse signal having a constant voltage value. As a result, the gate-source voltage of the transistor MN3 (MN4) decreases by the voltage drop of the resistor R3 (R4), so that the source current thereof balances at a certain current value. Having the resistor R3 (R4), the level shift circuit of the present embodiment can fix the drain current of the transistor MN3 (MN4).

Figure 8:
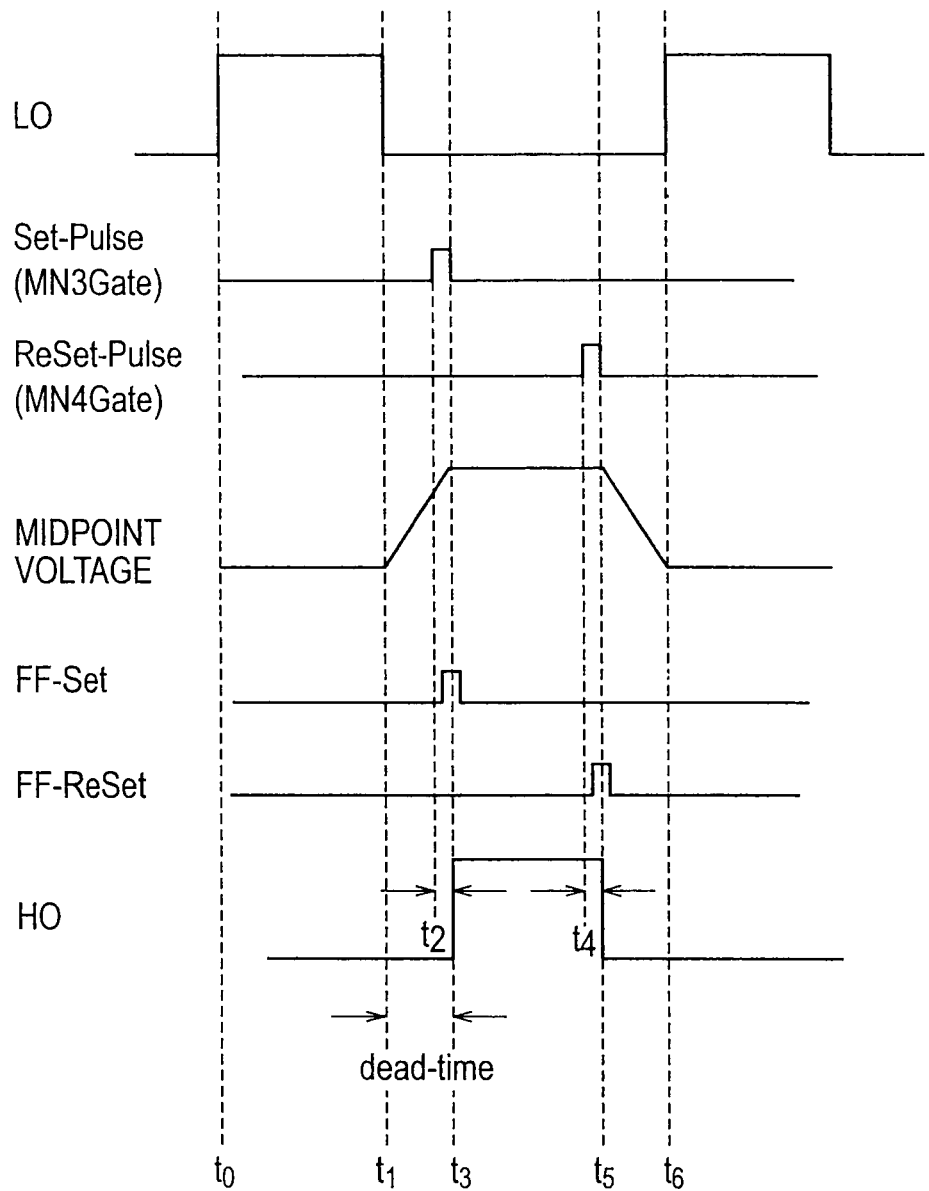

FIG. 8 is a timing chart illustrating operation of the level shift circuit according to Embodiment 1 optimized for high frequencies. This level shift circuit is expected to be used in a current resonant switching power source apparatus such as the one illustrated in FIG. 5.

Generally, high- and low-side ON signals are each provided with a dead time to prevent the signals from simultaneously turning on. The dead time is optionally set with the use of, for example, resistors. The duration of the transient voltage dv/dt is largely determined by a resonant circuit and load current. An optimized application circuit has a dead time that is adjusted by resistors and the like so that signal transmission from a low side to a high side starts during the duration of the transient voltage dv/dt, and after a transmission delay time, the high side turns on substantially simultaneously when the duration of the transient voltage dv/dt ends. In practice, a slight margin is set to slightly delay the turning on of the high side from the end of the transient voltage dv/dt.

In FIG. 8, an interval between t1 and t3 is a dead time in which the high-side switching element 17a and low-side switching element 18a illustrated in FIG. 5 are OFF. Ideally, at time t3 when the midpoint voltage reaches a peak, the voltage HO applied to the gate of the high-side switching element 17a becomes high so that the ON time of the high-side switching element 17a is maximized to maximize the use rate of the high-side switching element 17a.

Figure 7:
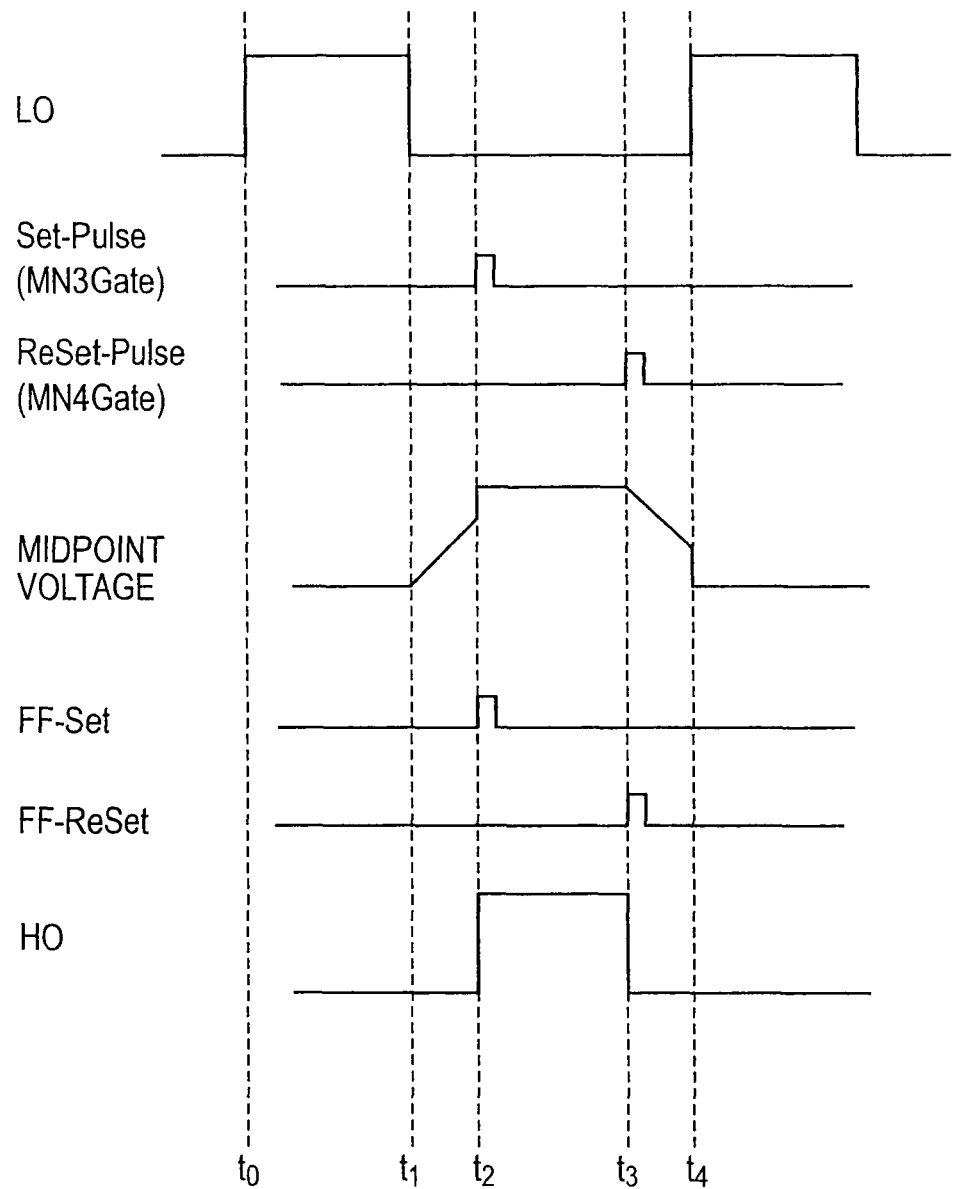

According to the waveforms illustrated in FIGS. 6 and 7, the pulse generator 10 outputs a set pulse when the flip-flop 12 makes the voltage HO high. On the other hand, the waveforms of FIG. 8 involves the delay time. In an actual circuit, there is an unignorable circuit delay time between when the pulse generator 10 outputs the set pulse signal MN3 Gate and when the voltage HO becomes high. To make the voltage HO high at time t3, the pulse generator 10 must output the set pulse signal when the transient voltage dv/dt is applied to the midpoint voltage, and therefore, a signal must be transmitted even in this state from the low-side control circuit to the high-side control circuit.

The level shift circuit according to Embodiment 1 of the present invention can transmit a signal even when the transient voltage dv/dt is applied because it causes a voltage imbalance between the drain of the transistor MN3 and the drain of the transistor MN4. Consequently, the level shift circuit of Embodiment 1 can realize the above-mentioned ideal operation. Namely, Embodiment 1 turns on the high-side switching element 17a when the transient voltage dv/dt ends, to maximize the ON time of the switching element 17a and realize ZVS.

Embodiment 2

Figure 9:
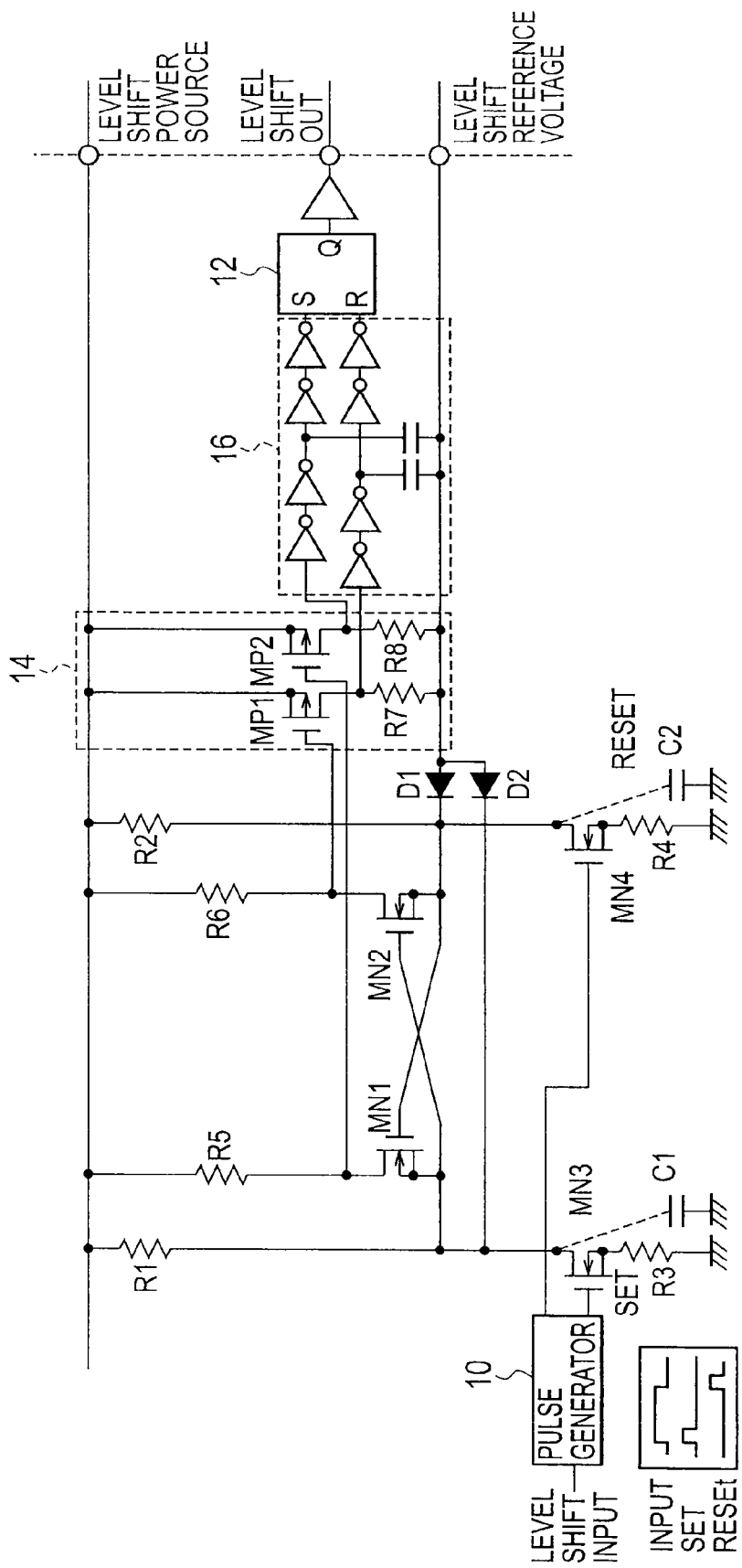
FIG. 9 is a circuit diagram illustrating a level shift circuit according to Embodiment 2 of the present invention.

FIG. 9 is a circuit diagram illustrating a level shift circuit according to Embodiment 2 of the present invention. Embodiment 2 differs from Embodiment 1 illustrated in FIG. 4 in that Embodiment 2 additionally uses diodes D1 and D2, a buffer part 14, and a filter part 16. Like the level shift circuit of Embodiment 1, the level shift circuit of Embodiment 2 is used in a switching power source apparatus such as the one illustrated in FIG. 5.

The buffer part 14 has transistors MP1 and MP2 and resistors R7 and R8.

The transistor MP2 and resistor R8 correspond to the "first amplifier" stipulated in the claims and are arranged between a control part and a flip-flop 12, to amplify a set signal generated by the control part so that the set signal is detected by the flip-flop 12.

The transistor MP2 corresponds to the "first p-type MOSFET" stipulated in the claims and has a source connected to a level shift power source and a gate connected to a resistor R5, to turn on/off in response to the set signal provided by the control part. The resistor R8 corresponds to the "third resistor" stipulated in the claims and has a first end connected to a drain of the transistor MP2 and a second end connected to a level shift reference voltage point.

Namely, the first amplifier includes the transistor MP2 and resistor R8 that are connected in series between the level shift power source and the level shift reference voltage point having a predetermined voltage difference with respect to the level shift power source.

The transistor MP1 and resistor R7 correspond to the "second amplifier" stipulated in the claims and are arranged between the control part and the flip-flop 12, to amplify a reset signal generated by the control part so that the reset signal is detected by the flip-flop 12.

The transistor MP1 corresponds to the "second p-type MOSFET" stipulated in the claims and has a source connected to the level shift power source and a gate connected to a resistor R6, to turn on/off in response to the reset signal provided by the control part. The resistor R7 corresponds to the "fourth resistor" stipulated in the claims and has a first end connected to a drain of the transistor MP1 and a second end connected to the level shift reference voltage point.

Namely, the second amplifier includes the transistor MP1 and resistor R7 that are connected in series between the level shift power source and the level shift reference voltage point having the predetermined voltage difference with respect to the level shift power source.

The filter part 16 filters the set signal and reset signal amplified by the buffer part 14 and outputs the filtered signals to the flip-flop 12. The filter part 16 is arranged to further improve noise resistance. The filter part 16 is not always necessary. However, inverters to change analog signals into digital signals must be arranged.

The diodes D1 and D2 serve as a protection circuit for transistors MN1 and MN2. Even when transistors MN3 and MN4 are operating, the diodes D1 and D2 prevent a voltage from exceeding the withstand voltage of the transistors MN1 and MN2.

The remaining configuration of Embodiment 2 is the same as that of Embodiment 1, and therefore, explanation thereof is omitted.

Operation of the present embodiment will be explained. First, problems of the related arts will be explained. The level shift circuit of the related art illustrated in FIG. 2 uses voltage drops of the resistors 4 and 5 with respect to the level shift power source, to convert currents passing through the MOSFETs 20 and 30 into voltages, so that the voltages are detected by the inverters 6 and 7. The detection threshold values of the inverters 6 and 7 are set with respect to the level shift reference voltage (the line L1 in FIG. 2). If the level shift reference voltage becomes lower than a low-side reference voltage by, for example, 3 V, the level shift circuit of the related art is unable to transmit signals to the circuit elements arranged after the inverters 6 and 7 when a signal is transmitted from the low side to the high side because voltages from the MOSFETs 20 and 30 do not decrease to the detection voltages of the inverters 6 and 7 even when the MOSFETs 20 and 30 turn on.

On the other hand, the level shift circuit of the present embodiment has the buffer part 14 so that signals generated by the control part are amplified by the transistors MP1 and MP2. In addition, the present embodiment uses the resistors R7 and R8 to obtain detection voltages from the level shift reference voltage. Even if the level shift reference voltage becomes lower than a low-side reference voltage, the level shift circuit normally operates, thereby expanding an operating range compared with the related art.

The resistors R8 and R7 shift the levels of set and reset signals toward the level shift reference voltage, so that the set and reset signals are correctly detected by the inverters.

The remaining operation of Embodiment 2 is the same as that of Embodiment 1, and therefore, explanation thereof is omitted.

In this way, the level shift circuit according to the present embodiment and the switching power source apparatus employing the level shift circuit provide the same effects as those according to Embodiment 1, and in addition, are capable of correctly detecting set and reset signals even if the level shift reference voltage becomes lower than the low-side reference voltage, to surely transmit signals from the low side to the high side.

When the high-side switching element 17a turns off, the level shift reference voltage decreases from around 420 V to 0 V. At this time, the level shift reference voltage sometimes overshoots to a negative voltage. In this case, the level shift circuit of the present embodiment employing the buffer part 14 is effective.

As mentioned above, the level shift circuit according to the present invention and the switching power source apparatus employing the level shift circuit are manufacturable at low cost, are appropriate for miniaturization, and are capable of reducing power consumption, increasing operating frequencies, and preventing a transient voltage dv/dt from malfunctioning a flip-flop.

The present invention is applicable to a level shift circuit serving as an interface between circuits having different power source voltages and to a switching power source apparatus.

This application claims benefit of priority under 35USC §119 to Japanese Patent Application No. 2009-263626, filed on Nov. 19, 2009, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:
1. A level shift circuit comprising:
a first resistor having a first end being connected to a level shift power source;
a first n-type MOSFET having a drain connected to a second end of the first resistor and a source connected to the ground;

a second resistor having a first end connected to the level shift power source, the first and second resistors having the same resistance value;

a second n-type MOSFET having a drain connected to a second end of the second resistor and a source connected to the ground;

a pulse generator configured to control ON/OFF of the first and second n-type MOSFETs according to an input signal;

a control part configured to generate a set signal as the first n-type MOSFET is ON, a reset signal as the second n-type MOSFET is ON, and no signal as there is no voltage difference between a voltage at the drain of the first n-type MOSFET and a voltage at the drain of the second n-type MOSFET; and a flip-flop configured to provide an output signal according to the set and reset signals generated by the control part, the output signal being a level-shifted signal of the input signal, wherein the control part includes:

a fifth resistor having a first end connected to the level shift power source;

a third n-type MOSFET having a drain connected to a second end of the fifth resistor and a set terminal of the flip-flop, a source connected to the drain of the first n-type MOSFET, and a gate connected to the drain of the second-type MOSFET;

a sixth resistor having a first end connected to the level shift power source, the fifth and sixth resistors having the same resistance value; and a fourth n-type MOSFET having a drain connected to a second end of the sixth resistor and a reset terminal of the flip-flop, a source connected to the drain of the second n-type MOSFET, and a gate connected to the drain of the first n-type MOSFET.

2. The level shift circuit of claim 1, further comprising:

a seventh resistor connected between the source of the first n-type MOSFET and the ground; and an eighth resistor connected between the source of the second n-type MOSFET and the ground.

3. A switching power source apparatus having a high-side switching element and a low-side switching element comprising the level shift circuit of claim 1 for controlling the high-side switching element.

4. A level shift circuit comprising:

a first resistor having a first end being connected to a level shift power source;

a first n-type MOSFET having a drain connected to a second end of the first resistor and a source connected to the ground;

a second resistor having a first end connected to the level shift power source, the first and second resistors having the same resistance value;

a second n-type MOSFET having a drain connected to a second end of the second resistor and a source connected to the ground;

a pulse generator configured to control ON/OFF of the first and second n-type MOSFETs according to an input signal;

a control part configured to generate a set signal as the first n-type MOSFET is ON, a reset signal as the second n-type MOSFET is ON, and no signal as there is no voltage difference between a voltage at the drain of the first n-type MOSFET and a voltage at the drain of the second n-type MOSFET; and a flip-flop configured to provide an output signal according to the set and reset signals generated by the control part, the output signal being a level-shifted signal of the input signal, wherein a first amplifier arranged between the control part and the flip-flop, the first amplifier being configured to amplify the set signal of the control part so that the set signal is detected by the flip-flop; and a second amplifier arranged between the control part and the flip-flop and configured to amplify the reset signal generated of the control part so that the reset signal is detected by the flip-flop.

5. The level shift circuit of claim 4, wherein:

the first amplifier includes a first p-type MOSFET and a third resistor that are connected in series between the level shift power source and a level shift reference voltage point having a predetermined voltage difference with respect to the level shift power source;

the second amplifier includes a second p-type MOSFET and a fourth resistor that are connected in series between the level shift power source and the level shift reference voltage;

the first p-type MOSFET turns on and off according to the set signal generated by the control part; and the second p-type MOSFET turns on and off according to the reset signal generated by the control part.

6. The level shift circuit of claim 4, wherein the control part includes:

a fifth resistor having a first end connected to the level shift power source;

a third n-type MOSFET having a drain connected to a second end of the fifth resistor and a set terminal of the flip-flop, a source connected to the drain of the first n-type MOSFET, and a gate connected to the drain of the second n-type MOSFET;

a sixth resistor having a first end connected to the level shift power source, the fifth and sixth resistors having the same resistance value; and a fourth n-type MOSFET having a drain connected to a second end of the sixth resistor and a reset terminal of the flip-flop, a source connected to the drain of the second n-type MOSFET, and a gate connected to the drain of the first n-type MOSFET.

7. The level shift circuit of claim 5, wherein the control part includes:

a fifth resistor having a first end connected to the level shift power source;

a third n-type MOSFET having a drain connected to a second end of the fifth resistor and a set terminal of the flip-flop, a source connected to the drain of the first n-type MOSFET, and a gate connected to the drain of the second n-type MOSFET;

a sixth resistor having a first end connected to the level shift power source, the fifth and sixth resistors having the same resistance value; and a fourth n-type MOSFET having a drain connected to a second end of the sixth resistor and a reset terminal of the flip-flop, a source connected to the drain of the second n-type MOSFET, and a gate connected to the drain of the first n-type MOSFET.

* * * * *